(12) United States Patent
Yamagami

(10) Patent No.: US 7,817,460 B2
(45) Date of Patent: Oct. 19, 2010

(54) SEMICONDUCTOR MEMORY DEVICE

(75) Inventor: Yoshinobu Yamagami, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/503,523

(22) Filed: Jul. 15, 2009

(65) Prior Publication Data

US 2009/0279347 A1   Nov. 12, 2009

Related U.S. Application Data

(62) Division of application No. 11/650,482, filed on Jan. 8, 2007, now Pat. No. 7,577,014.

(30) Foreign Application Priority Data

Mar. 1, 2006 (JP) ............................. 2006-054614

(51) Int. Cl.
*G11C 11/00* (2006.01)
*G11C 5/14* (2006.01)

(52) U.S. Cl. ........................ 365/154; 365/226; 365/227; 365/228; 365/229

(58) Field of Classification Search ................. 365/226, 365/227, 228, 229, 154, 155, 156
See application file for complete search history.

(56) References Cited

U.S. PATENT DOCUMENTS

| 5,065,363 | A |   | 11/1991 | Sato et al. |
| 5,159,571 | A |   | 10/1992 | Ito et al. |
| 5,301,147 | A | * | 4/1994 | Guo et al. .................. 365/154 |
| 5,490,105 | A |   | 2/1996 | Chandna et al. |
| 5,544,097 | A |   | 8/1996 | McClure et al. |
| 5,812,445 | A |   | 9/1998 | Yamauchi |
| 6,034,886 | A |   | 3/2000 | Chan et al. |
| 6,205,049 | B1 |   | 3/2001 | Lien et al. |
| 6,657,243 | B2 |   | 12/2003 | Kumagai et al. |

(Continued)

FOREIGN PATENT DOCUMENTS

JP          55-64686 A       5/1980

(Continued)

OTHER PUBLICATIONS

United States Office Action issued in U.S. Appl. No. 11/476,566, mailed Oct. 28, 2008.

(Continued)

*Primary Examiner*—Ly D Pham
(74) *Attorney, Agent, or Firm*—McDermott Will & Emery LLP

(57) ABSTRACT

A semiconductor memory device having a memory cell including a flip-flop; and a memory cell power supply circuit for supplying a low voltage cell power supply voltage to the memory cell. The memory cell power supply circuit supplies a cell power supply voltage in a first period and a different cell power supply voltage in a second period, a predetermined first power supply voltage in case where the cell power supply voltage in supplied in a data read cycle and in a case where data is not written to a memory cell to which the cell power supply voltage is supplied in a write cycle, and a second power supply voltage higher than the first power supply voltage in a case where data is written to a memory cell to which the cell power supply voltage is supplied in a write cycle.

12 Claims, 8 Drawing Sheets

U.S. PATENT DOCUMENTS

| | | |
|---|---|---|
| 6,678,202 B2 | 1/2004 | Scott |
| 6,862,227 B2 | 3/2005 | Yamaoka et al. |
| 6,876,573 B2 | 4/2005 | Higeta et al. |
| 6,958,947 B2 | 10/2005 | Park et al. |
| 6,967,879 B2 | 11/2005 | Mizukoshi |
| 6,990,035 B2 | 1/2006 | Redwine et al. |
| 7,177,176 B2 | 2/2007 | Zheng et al. |
| 2001/0006476 A1 | 7/2001 | Itoh et al. |
| 2005/0047197 A1 | 3/2005 | Kotabe et al. |
| 2005/0122821 A1 | 6/2005 | Redwine et al. |
| 2006/0171193 A1 | 8/2006 | Asayama et al. |
| 2007/0002662 A1 | 1/2007 | Yamagami et al. |
| 2008/0062802 A1 | 3/2008 | Lin et al. |
| 2008/0117665 A1* | 5/2008 | Abeln et al. ............... 365/154 |

OTHER PUBLICATIONS

Chinese Office Action, with English translation, issued in Chinese Patent Application No. CN 200610095997.9, mailed Feb. 6, 2009.

* cited by examiner

SEMICONDUCTOR MEMORY DEVICE

RELATED APPLICATIONS

This application is a Divisional of U.S. patent application Ser. No. 11/650,482, filed on Jan. 8, 2007 now U.S. Pat. No. 7,577,014, claiming priority of Japanese Patent Application No. 2006-054614, filed on Mar. 1, 2006, the entire contents of each of which are hereby incorporated by reference.

BACKGROUND OF THE INVENTION

1. Field of the Invention

The present invention relates to a semiconductor memory device including flip-flop-type memory cells and, more particularly, to a technique for controlling the memory cell power supply.

2. Description of the Background Art

As the process rule becomes finer and finer in recent years, the circuit area and the power supply voltage of semiconductor integrated circuits have been reduced rapidly. However, with a semiconductor memory device including flip-flop-type memory cells, such as a static-type random access memory (SRAM), for example, such advancement makes the characteristics variations between transistors of the memory cells more significant. Due to such characteristics variations and to the reduced power supply voltage, it is now very difficult to realize stable memory cell characteristics, thereby lowering the production yield of semiconductor memory devices.

FIG. 13 shows an SRAM memory cell of a flip-flop type, which is formed by ordinary CMOS transistors. In FIG. 13, QN1 and QN2 are drive transistors, QN3 and QN4 are access transistors, QP1 and QP2 are load transistors, WL is a word line, BL and /BL are bit lines, and VDD is the power supply.

The load transistor QP1 and the drive transistor QN1 together form an inverter, and the load transistor QP2 and the drive transistor QN2 together form another inverter. The input/output terminals of the inverters are connected together to thereby form a flip-flop. The gate terminals of the access transistors QN3 and QN4 are connected to the word line WL, and the drain terminals thereof are connected to the bit lines BL and /BL, respectively. The source terminals of the access transistors QN3 and QN4 are connected to the input/output terminals of the inverters.

Data is written to the SRAM memory cell of FIG. 13 as follows. The bit lines BL and /BL are pre-charged to an H level. Then, the word line WL is brought from an L level to the H level (active) while the potential of one of the bit lines BL and /BL is brought from the H level to the L level.

Common memory cell characteristics of an SRAM include the write level and the static noise margin.

The write level represents the voltage with which data is written to the memory cell. Data is written to an SRAM memory cell by inverting the state of the flip-flop of the memory cell (note however that the state of the flip-flop is not inverted when the write data happens to be the same as the stored data). The critical bit line potential with which the state of the flip-flop of the memory cell can be inverted is referred to as the write level.

A lower write level gives a larger margin for erroneous writing (static noise margin) due to bit line noise, or the like, but presents a problem in that the flip-flop cannot be inverted until the bit line potential becomes sufficiently low, thereby resulting in a long write time. A higher write level gives a shorter write time, but also gives a smaller margin for erroneous writing (static noise margin).

A lower write level also means that the state of the flip-flop of the memory cell is less easily inverted due to bit line noise, or the like, in a read operation period, i.e., a larger static noise margin, and a higher write level also means that the state of the flip-flop of the memory cell is more easily inverted in a read operation period, i.e., a smaller static noise margin.

Thus, there is a trade-off between the write level and the static noise margin.

In order to solve such a problem, Japanese Laid-Open Patent Publication No. 55-64686, for example, discloses a technique for improving the write level by controlling the power supply voltage of the memory cell.

As the process rule becomes finer, there is a problem of an increased leak current flowing through transistors being OFF. Particularly, the memory cell section is often formed by transistors with small gate widths in order to reduce the area of the semiconductor memory device. A transistor with a smaller gate width, as compared with a transistor with a larger gate width, has a larger off-leak current per unit gate width.

The off-leak current flowing through a memory cell also varies depending on the arrangement of the memory cell array, the transistor characteristics (different impurity concentrations), the operating power supply voltage, the temperature condition, etc.

For example, in a write operation in a case where the power supply of a memory cell is controlled, the power supply voltage of memory cells connected to non-selected bit lines, other than the selected bit line to which data is to be written, will decrease unless there is supplied a charge sufficient to compensate for the amount of charge to be lost by the off-leak current flowing through the memory cells connected to the non-selected bit lines. Similarly, in a non-write operation period (in a read operation period), the power supply voltage of the memory cells connected to all bit lines will decrease unless there is supplied a charge sufficient to compensate for the amount of charge to be lost by the off-leak current flowing through the memory cells connected to the bit lines. If the power supply voltage of a memory cell decreases, the static noise margin of the memory cell deteriorates, whereby data in the memory cell is more likely to be corrupted (inverted).

In the configuration disclosed in FIG. 2 of Japanese Laid-Open Patent Publication No. 55-64686, the power supply voltage of the memory cell is set to a level lower than the VDD level in a non-write operation period (in a read operation period). Therefore, as described above, the static noise margin of the memory cell deteriorates, and corruption of memory cell data is more likely to occur.

In the configuration disclosed in FIG. 1 of Japanese Laid-Open Patent Publication No. 55-64686, no countermeasures are taken for the very high leak current level flowing through the memory cell, which occurs in semiconductor memory devices of the latest generation. In a write operation period, if there is a very high off-leak current through memory cells connected to non-selected bit lines other than the selected bit line to which data is to be written, there is also a substantial drop in the memory cell power supply voltage caused by the off-leak current. Therefore, the static noise margin of the memory cell deteriorates, and corruption of memory cell data is more likely to occur.

Moreover, in the configuration disclosed in FIG. 1 of Japanese Laid-Open Patent Publication No. 55-64686, since the output of the inverter including a depletion transistor and an enhancement transistor connected in series together is supplied as the power supply of the memory cell, there is always a through current in a write operation period. Moreover, the configuration employs the depletion transistor in order to compensate for the amount of charge to be lost by the off-leak current flowing through the memory cells connected to the non-selected bit lines. However, as the process rule becomes finer, there is a problem of an increased leak current flowing through transistors being OFF, as described above. Therefore, in order to compensate for the amount of charge to be lost by the off-leak current, it is necessary to employ a depletion transistor with a sufficiently large driving capability. This in turn requires an increase in the driving capability of an enhancement transistor in order to sufficiently lower the memory cell power supply. With the approach disclosed in FIG. 1 of Japanese Laid-Open Patent Publication No. 55-64686, the through current flowing through the inverter including a depletion transistor and an enhancement transistor connected in series together increases, thereby increasing the power consumption. Another problem is that increasing the driving capability of the transistors will increase the layout area.

Japanese Laid-Open Patent Publication No. 55-64686 also fails to take measures to optimally compensate for the leak current depending on the arrangement of the memory cell array, the transistor characteristics, the operating power supply voltage, the temperature condition, etc. Therefore, unless the power supply of the memory cell is controlled appropriately depending on the arrangement of the memory cell array, the transistor characteristics, the operating power supply voltage, the temperature condition, etc., the power consumption and the layout area will increase.

SUMMARY OF THE INVENTION

It is therefore an object of the present invention to provide a semiconductor memory device in which it is possible to optimally control the memory cell power supply depending on the arrangement of the memory cell array, the transistor characteristics, the operating power supply voltage, the temperature condition, etc.

In view of the above, the present invention provides a semiconductor memory device, comprising a memory cell including a flip-flop, and a memory cell power supply circuit for supplying a low voltage cell power supply voltage to the memory cell, wherein the memory cell power supply circuit supplies a cell power supply voltage in a first period and a different cell power supply voltage in a second period, and supplies a predetermined first power supply voltage in a case where the cell power supply voltage is supplied in a data read cycle and in a case where data is not written to a memory cell to which the cell power supply voltage is supplied in a write cycle, while the memory cell power supply circuit supplies a second power supply voltage higher than the first power supply voltage in a case where data is written to a memory cell to which the cell power supply voltage is supplied in a write cycle.

DETAILED DESCRIPTION OF THE PREFERRED EMBODIMENTS

Figure 1:
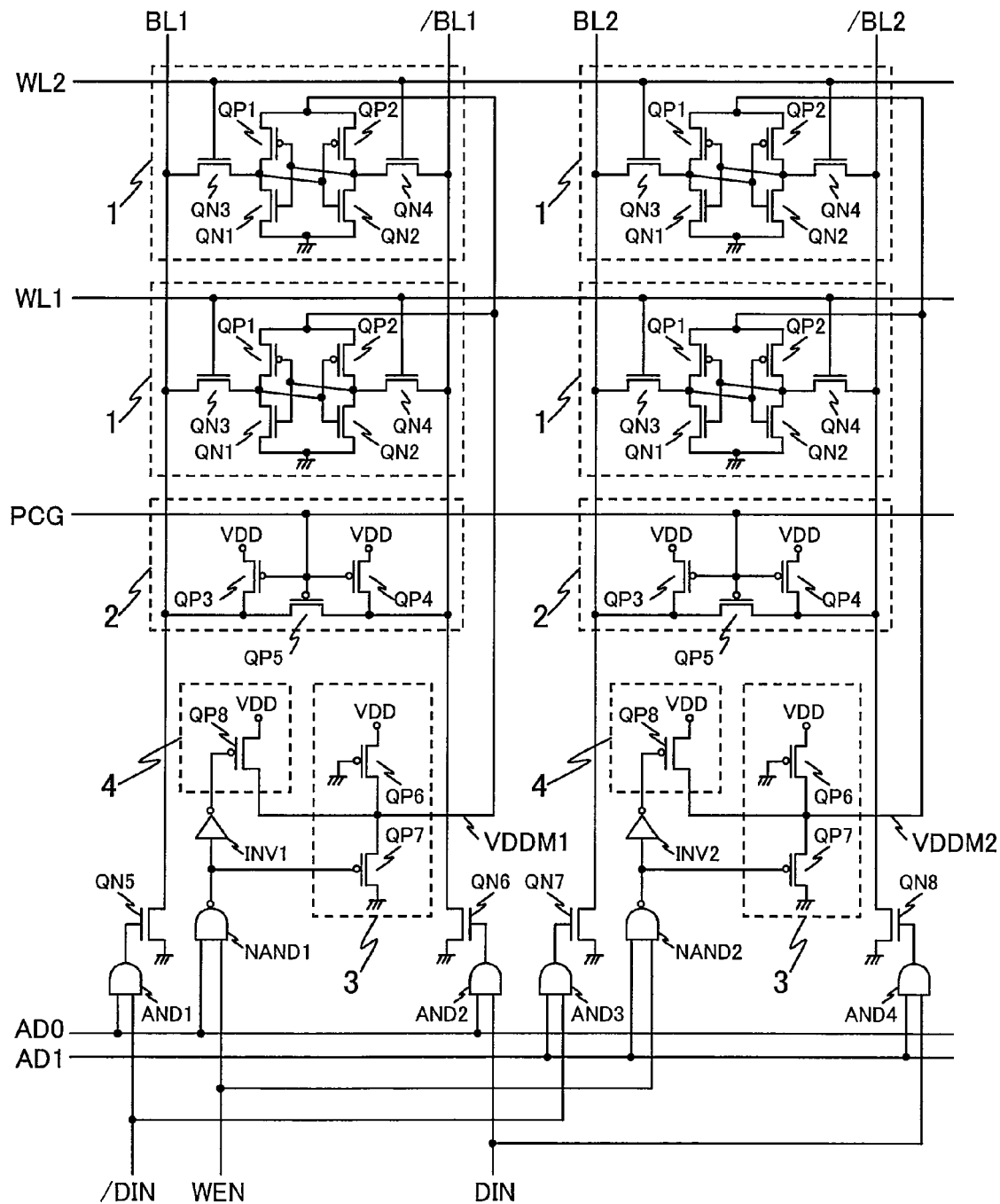
FIG. 1 is a circuit diagram showing a configuration of a semiconductor memory device of Reference Example 1.

In a semiconductor memory device of the present invention, it is possible to optimally control the memory cell power supply depending on the arrangement of the memory cell array, the transistor characteristics, the power supply voltage, the temperature condition, etc. Particularly, the memory cell write level is improved, whereby it is possible to realize a semiconductor memory device having stable memory cell characteristics with a low power consumption and a small area.

Preferred embodiments of the present invention will now be described with reference to the drawings. Note that in each of the following embodiments, like elements to those of any preceding embodiments will be denoted by like reference numerals, and will not be described repeatedly.

REFERENCE EXAMPLE 1

FIG. 1 shows a configuration of a semiconductor memory device according to Reference Example 1 of the present invention. Circuits for reading data are omitted in the figure for the sake of simplicity.

The semiconductor memory device shown in FIG. 1 includes memory cells 1, precharge circuits 2, memory cell power supply control circuits 3, and leak compensation circuits 4. In FIG. 1, QN1 to QN2 are drive transistors, QN3 to QN4 are access transistors, QN5 to QN8 are N-type MOS transistors, QP1 to QP2 are load transistors, QP3 to QP4 are precharge transistors, QP5 is an equalization transistor, QP6 to QP8 are P-type MOS transistors, INV1 to INV2 are inverters, AND1 to AND4 are 2-input AND circuits, NAND1 to NAND2 are 2-input NAND circuits, WL1 to WL2 are word lines, BL1 to BL2 and /BL1 to /BL2 are bit lines, PCG is a precharge control signal, AD0 to AD1 are column address signals, DIN and /DIN are input data, WEN is a write enable control signal, VDDM1 to VDDM2 are memory cell power supplies, and VDD is the power supply.

Each memory cell 1 is provided at the intersection between the word line WL1 or WL2 extending in the row direction and the bit line BL1, /BL1 or BL2, /BL2 extending in the column direction. The memory cells 1 arranged in a matrix pattern together form a memory array section for storing information. In the memory cell 1, the load transistor QP1 and the drive transistor QN1 together form an inverter, and the load transistor QP2 and the drive transistor QN2 together form another inverter. The input/output terminals of the inverters are connected together to thereby form a flip-flop. The gate terminals of the access transistors QN3 and QN4 are connected to the word line WL1 (WL2), and the drain terminals are connected to the bit lines BL1 and /BL1 (BL2 and /BL2). The source terminals of the access transistors QN3 and QN4 are connected to the input/output terminals of the inverters. The source terminals of the load transistors QP1 and QP2 forming an inverter are connected to the memory cell power supply VDDM1 (VDDM2) being the output of the memory cell power supply control circuit 3.

Each precharge circuit 2 is provided at the intersection between the precharge control signal PCG extending in the row direction and the bit line BL1, /BL1 or BL2, /BL2 extending in the column direction. The precharge circuit 2 is formed by the precharge transistors QP3 and QP4 and the equalization transistor QP5, and the gate terminals of these transistors are connected to the precharge control signal PCG. The source terminals of the precharge transistors QP3 and QP4 are connected to the power supply VDD, and the drain terminals are connected to the source terminal and the drain terminal of the equalization transistor QP5. The drain terminals of the precharge transistors QP3 and QP4 are also connected to the bit lines BL1 and /BL1 (BL2 and /BL2).

In the precharge circuit 2, the precharge control signal PCG is at the L level when the word line is inactive (the L level), thereby precharging the bit lines to the H level. If one of the word lines is active (the H level), the precharge control signal PCG is at the H level, whereby all the P-type MOS transistors QP3 to QP5 of the precharge circuit 2 are turned OFF, thereby achieving a state (the high impedance state) where there is no influence on the bit lines.

The memory cell power supply control circuit 3 is provided for each column to provide the memory cell power supply VDDM1 (VDDM2) to the memory cells 1 provided along the same bit line. The memory cell power supply control circuit 3 includes the P-type MOS transistor QP6 whose source terminal is connected to the power supply VDD and whose gate terminal is grounded, and the P-type MOS transistor QP7 whose source terminal is connected to the drain terminal of the P-type MOS transistor QP6 and whose drain terminal is grounded. The connection node between the drain terminal of the P-type MOS transistor QP6 and the source terminal of the P-type MOS transistor QP7 is output as the memory cell power supply VDDM1 (VDDM2). The gate terminal of the P-type MOS transistor QP7 is connected to the output node of the 2-input NAND circuit NAND1 (NAND2) receiving the column address signal AD0 (AD1) and the write enable control signal WEN. In the memory cell power supply control circuit 3, the P-type MOS transistor QP6 being always ON and the P-type MOS transistor QP7 controlled by the column address signal and the write enable control signal are connected in series together, thereby forming a source follower.

The memory cell power supply control circuit 3 operates as follows when writing data to the memory cell 1 connected to a bit line being selected by the column address signal. For example, when the column address signal AD0 is at the H level (AD1 is at the L level) and the write enable control signal WEN is at the H level, the output of the 2-input NAND circuit NAND1 is brought to the L level, and the P-type MOS transistor QP7 is turned ON, whereby the power supply of the memory cell 1 connected to the bit lines BL1 and /BL1 (the memory cell power supply VDDM1) is forcibly controlled to a voltage value lower than the VDD level that is determined by the voltage divider ratio between the P-type MOS transistors QP6 and QP7.

In a write operation, the voltage level of the memory cell power supply output from the memory cell power supply control circuit 3 is determined depending on the power supply VDD and the voltage divider ratio (strictly speaking, it is also dependent on the cell leak). Then, the write level of the memory cell 1 is determined depending on the voltage level of the memory cell power supply (strictly speaking, it is also dependent on the threshold voltage of the load transistors QP1 and QP2 of the memory cell 1). Therefore, it is possible to realize a desirable write level by appropriately setting the voltage divider ratio, whereby it is possible to easily realize both the ease of data writing and a desirable write margin.

In a case where the write enable control signal WEN is at the L level or the column address signal is at the L level (i.e., a case where the power supply is provided to the memory cell 1 when no data is being written, or a case where data is being written and the power supply is provided to the memory cells 1 connected to non-selected bit lines, other than the bit line being selected by the column address signal), the output of the 2-input NAND circuit NAND1 (NAND2) is at the H level, and the P-type MOS transistor QP7 is turned OFF, whereby the memory cell power supply VDDM1 (VDDM2) is controlled to be at the VDD level by the P-type MOS transistor QP6. Thus, a charge is supplied in a manner similar to that of the leak compensation circuit 4 to be described later.

One leak compensation circuit 4 is provided for each column, and includes the P-type MOS transistor QP8. The source terminal of the P-type MOS transistor QP8 is connected to the power supply VDD, and the drain terminal is connected to the memory cell power supply VDDM1 (VDDM2). The gate terminal of the P-type MOS transistor QP8 is connected to the output node of the inverter INV1 (INV2), which receives the output of the 2-input NAND circuit NAND1 (NAND2) receiving the column address signal AD0 (AD1) and the write enable control signal WEN. Thus, the gate terminal of the P-type MOS transistor QP8 receives the logical product between the column address signal and the write enable control signal WEN.

Data is written to the memory cell 1 connected to the bit line being selected by the column address signal (the write enable control signal WEN at the H level) as follows, in a case where, for example, the column address signal AD0 is at the H level (AD1 at the L level) and the write enable control signal WEN is at the H level. The gate input of the P-type MOS transistor QP8 of the leak compensation circuit 4 corresponding to the bit lines BL1 and /BL1 being selected by the column address signal is at the H level, and the P-type MOS transistor QP8 is turned OFF, whereby there is no influence on the memory cell power supply VDDM1. On the other hand, the gate input of the P-type MOS transistor QP8 of the leak compensation circuit 4 corresponding to the non-selected bit lines BL2 and /BL2 is at the L level, and the P-type MOS transistor QP8 is turned ON, whereby the VDD level is supplied to the memory cell power supply VDDM2.

In a non-write operation period (in a read operation period), the write enable control signal WEN is at the L level. Therefore, for all the leak compensation circuits 4, the gate input of the P-type MOS transistor QP8 is at the L level and the P-type MOS transistor QP8 is turned ON, whereby the VDD level is supplied to all the memory cell power supplies VDDM1 and VDDM2.

As described above, in a write operation period, the leak compensation circuit 4 does not influence the memory cells 1 along the selected bit line while supplying the VDD level to the memory cell power supply for the memory cells 1 along each non-selected bit line. In a non-write operation period (in a read operation period), the VDD level is supplied to the memory cell power supplies for the memory cells 1 along all bit lines.

The N-type MOS transistors QN5 to QN8 each operate as a write buffer circuit for writing data to the memory cells 1. The drain terminals of these transistors are connected to the bit lines BL1, /BL1, BL2 and /BL2, and the source terminals are grounded. The gate terminals receive the output signals from the 2-input AND circuits AND1 to AND4, each being a logical product between the column address signal AD0 or AD1 and the input data DIN or /DIN.

For example, data is written as follows to the memory cell 1 provided at the intersection between the word line WL1 and the bit lines BL1 and /BL1.

First, the precharge control signal PCG is brought to the L level, and all the bit lines are brought to the precharged state (the H level). Then, when the precharge control signal PCG is brought to the H level, the precharged state of the bit lines is canceled, whereby the word line WL1, for example, is brought to the H level (active) (the word line WL2 is at the L level). Then, the column address signal AD0, for example, is brought to the H level (the column address signal AD1 is at the L level), and the H level is input as the input data DIN (the input data /DIN is at the L level), for example. Since the column address signal AD0 is at the H level and the input data DIN is at the H level, only the 2-input AND circuit AND2 outputs the H level (the 2-input AND circuits AND1, AND3 and AND4 output the L level), and only the N-type MOS transistor QN6, among other write buffer circuits, is turned ON. Therefore, only the bit line /BL1 is at the L level, thus allowing for a data write operation to the memory cell 1, to which data is to be written.

By lowering the power supply of the flip-flop forming a memory cell (the memory cell power supply) from the VDD level, the voltage at which data can be written to the memory cell is improved (the write level of the memory cell is increased) in a data write operation for the memory cell, and there are also improvements on the lower limit operating voltage of the semiconductor memory device and the speed at which data is written to the memory cell.

Our evaluation shows that if the memory cell power supply is lowered by 150 mV where the power supply voltage VDD is 1.0 V for a memory cell of a 65 nm CMOS process, the lower limit operating voltage for a write operation is improved by about 200 mV and the speed at which data is written to the memory cell is improved by about 100 ps.

Therefore, by employing a configuration such that the power supply of the memory cells connected along the selected bit line, to which data is to be written, is lowered by the memory cell power supply control circuit 3 in a write operation period, as in the present reference example, it is possible to improve the lower limit operating voltage of the memory cell for a write operation (the write level of the memory cell) and to improve the write speed.

As the process rule becomes finer, there is a problem of an increased leak current flowing through transistors being OFF in the memory cell. As the number of memory cells connected to each bit line increases, the leak current increases, and the voltage drop in the memory cell power supply voltage also increases.

If the power supply of a non-selected memory cell connected along a bit line, to which data is not to be written, is lowered from the VDD level, in a write operation period, due to the voltage drop caused by the leak current through memory cells along the same bit line, the static noise margin of the memory cell deteriorates. Our evaluation shows that if there is a voltage drop of 20 mV from the VDD level in a memory cell of a 65 nm CMOS process where the power supply voltage VDD is 1.0 V, the static noise margin deteriorates by about 10 mV.

On the other hand, by employing a configuration such that the amount of charge to be lost through the memory cell leak current can be compensated for by the leak compensation circuit 4 in a write operation period or in a non-write operation period (in a read operation period), as in the present reference example, it is possible to improve the static noise margin of the memory cell.

As described above, it is possible to improve the write level while maintaining the static noise margin characteristics of the memory cell, whereby it is possible to realize a semiconductor memory device with stable memory cell characteristics.

REFERENCE EXAMPLE 2

Assume a case where due to process variations, or the like, the characteristics of the N-type MOS transistors in Reference Example 1 fluctuate, whereby the threshold voltage of the N-type MOS transistors changes. For example, if the threshold voltage of N-type MOS transistors increases, the threshold voltage of the access transistors QN3 and QN4 and the drive transistors QN1 and QN2, being N-type MOS transistors among all the transistors of the memory cell 1, increases. If the threshold voltage of the N-type MOS transistors increases, the static noise margin of the memory cell increases, but the write level of the memory cell decreases, thereby making it more difficult to write data to the memory cell. Then, in order to make it easier to write data to the memory cell, the memory cell power supply can be further reduced.

Figure 2:
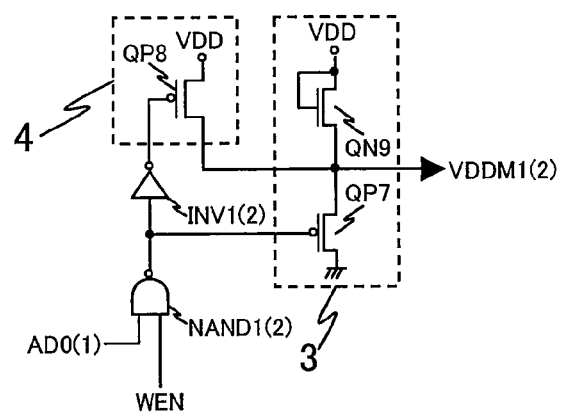
FIG. 2 is a circuit diagram showing a configuration of a memory cell power supply control circuit of Reference Example 2.

In view of this, the P-type MOS transistor QP6, which is always ON, of the memory cell power supply control circuit 3 of FIG. 1 is replaced by the N-type MOS transistor QN9, which is always ON, whose gate terminal and whose source terminal are both connected to the power supply VDD, as shown in FIG. 2. If the threshold voltage of the N-type MOS transistors increases, the threshold voltage of the replacing N-type MOS transistor QN9 also increases.

Since the driving capability of the N-type MOS transistor QN9, which is always ON, is decreased while maintaining the driving capability of the P-type MOS transistor QP7, the level of the memory cell power supply, which is determined by the voltage divider ratio between the N-type MOS transistor QN9 and the P-type MOS transistor QP7, decreases. If the threshold voltage of the N-type MOS transistors decreases, the level of the memory cell power supply increases.

Thus, using a transistor of the same polarity as that of the access transistors or the drive transistors, the P-type MOS transistor QP6 of the memory cell power supply control circuit 3 of FIG. 1 is replaced by the N-type MOS transistor QN9, whereby it is possible to easily control the memory cell power supply while following changes in the threshold voltage of the access transistors or the drive transistors.

REFERENCE EXAMPLE 3

In Reference Example 1, transistors of the memory cell power supply control circuit 3 are all P-type MOS transistors (FIG. 1). If the purpose is solely to provide a memory cell power supply, a P-type MOS transistor and an N-type MOS transistor may be connected in series together, or two N-type MOS transistors may be connected in series together.

However, actual transistors have variations in the transistor characteristics, due to process variations, etc. Particularly, where a P-type MOS transistor and an N-type MOS transistor are combined with each other, if their transistor characteristics vary in the opposite directions (e.g., if the driving capability of the P-type MOS transistor is decreased while that of the N-type MOS transistor is increased), such variations in the transistor characteristics have a greater influence, as compared with a case where MOS transistors of the same polarities are used. Therefore, if the memory cell power supply control circuit 3 is formed only by transistors of the same polarity, it is possible to reduce the possible influence of the transistor characteristics variations.

Figure 3:
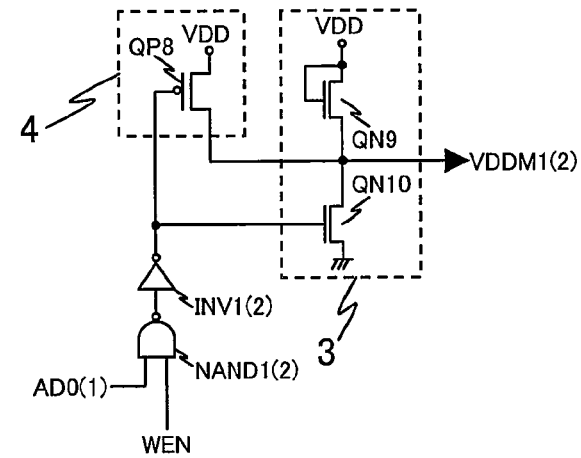
FIG. 3 is a circuit diagram showing a configuration of a memory cell power supply control circuit of Reference Example 3.

For example, the P-type MOS transistor QP6, which is always ON, of the memory cell power supply control circuit 3 of FIG. 1 may be replaced by the N-type MOS transistor QN9, which is always ON, whose gate terminal and whose source terminal are both connected to the power supply VDD, and the P-type MOS transistor QP7, which is connected in series with the N-type MOS transistor QN9 in FIG. 2 can be replaced by the N-type MOS transistor QN10, as shown in FIG. 3. As the P-type MOS transistor QP7 shown in FIG. 2 is replaced by the N-type MOS transistor QN10, the gate terminal input of the N-type MOS transistor QN10 can be switched from the output node of the 2-input NAND circuit NAND1 (NAND2) to the output node of the inverter INV1 (INV2).

As described above, if the memory cell power supply control circuit 3 is formed only by transistors of the same polarity, it is possible to reduce the influence caused by the difference between the characteristics variations of P-type transistors and those of N-type transistors in the memory cell power supply control circuit 3. Therefore, it is possible to supply a stable memory cell power supply voltage against such a difference in characteristics variations.

REFERENCE EXAMPLE 4

Figure 4:
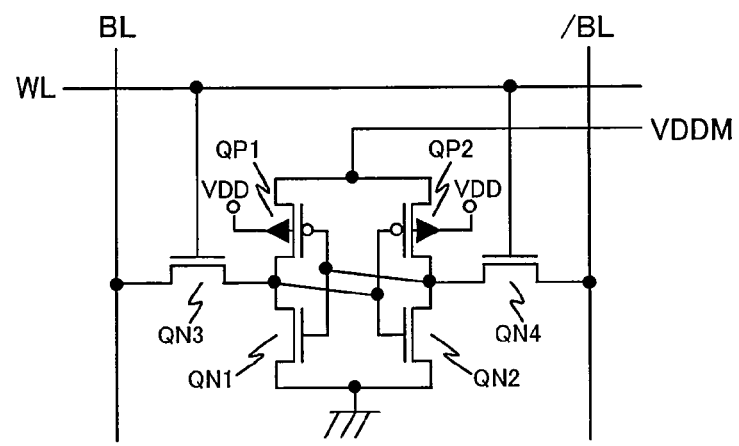
FIG. 4 is a circuit diagram showing a configuration of a memory cell of Reference Example 4.

It is preferred that the substrate nodes of the load transistors QP1 and QP2 of the memory cell 1 are connected to the VDD power supply (to separate the source nodes of the load transistors QP1 and QP2 from the substrate nodes) as shown in FIG. 4. In a write operation period, the memory cell power supply of the memory cell 1 connected to the selected bit line decreases from the VDD level as described above. If the substrate nodes of the load transistors QP1 and QP2 are at the VDD level, there will be a substrate bias effect for the load transistors QP1 and QP2, whereby the absolute value of the threshold voltage of the load transistors QP1 and QP2 increases and the driving capability decreases. Therefore, in a write operation, it is possible to more easily write data to the memory cell (the write level is improved). The increase in the absolute value of the threshold voltage of the load transistors QP1 and QP2 decreases the leak current flowing through memory cells that are connected to the selected bit line and are connected to word lines that are not being active, whereby it is possible to reduce the power consumption.

REFERENCE EXAMPLE 5

Moreover, the static noise margin of the memory cell can be improved at the same time by controlling the power supply of the memory cells connected to non-selected bit lines to be greater than or equal to the VDD level in a write operation period, while controlling the power supply of all the memory cells to be greater than or equal to the VDD level in a non-write operation period (in a read operation period). Specifically, this can be achieved easily by replacing the level of the power supply VDD received by the source terminal of the P-type MOS transistor QP8 forming the leak compensation circuit 4 of FIG. 1 with a level greater than or equal to the VDD level. A level greater than or equal to the VDD level can be applied by providing a booster circuit capable of generating a voltage greater than or equal to the VDD level inside the SRAM macro, or may be supplied from outside the SRAM macro.

Regarding Output Voltage, Driving Capability, Etc., of Memory Cell Power Supply Control Circuit 3

The output voltage (the voltage divider ratio of the P-type MOS transistors QP6 and QP7, etc), the driving capability, etc., of the memory cell power supply control circuit 3 in the semiconductor memory device as described above will now be discussed.

If the characteristics, the driving capability, the size and the shape of transistors forming a memory cell, and the number of memory cells to be connected along the same bit line vary, the write level of the memory cell and the static noise margin thereof will vary, and the leak current flowing through the memory cell will also vary. The various characteristics parameters may also differ depending on the power supply voltage and the temperature condition during operation. Moreover, if the transistor size of the memory cell, the memory cell layout arrangement, the length of the memory cell in the bit line direction, etc., vary, the bit line load capacitance will vary, and the speed at which data is written to the memory cell will also vary. It is understood that it is preferable to provide the memory cell power supply control circuit 3 and the leak compensation circuit 4 capable of accommodating the various characteristics differences as described above.

At present, such circuit design accommodating the characteristics variations can be easily done by performing a high-precision circuit simulation.

Determination of Voltage Divider Ratio

The voltage divider ratio of the P-type MOS transistors QP6, QP7, etc., can be determined so that the write operation reliably can be completed within a predetermined period of time by the power supply voltage output from the memory cell power supply control circuit 3 during a write operation, while it is possible to obtain a sufficiently large margin for erroneous writing. Specifically, it is done as follows.

For example, the write level of a memory cell varies as the temperature of the semiconductor memory device changes. Specifically, when the temperature decreases, the threshold voltage of the transistors of the memory cell increases, whereby the write level of the memory cell decreases, and it is more difficult to write data to the memory cell. In view of this, the voltage of the memory cell power supply to be output according to the voltage divider ratio of the P-type MOS transistors QP6 and QP7 forming the memory cell power supply control circuit 3 can be determined according to the temperature of use. Specifically, for a memory to be used at a lower temperature, a lower voltage can be used as the memory cell power supply voltage so that the write level increases, and it is easier to write data to the memory cell.

On the other hand, if a semiconductor memory device is used under a high temperature condition, the threshold voltage of the transistors of the memory cell decreases, whereby the write level of the memory cell increases, and it is easy to write data to the memory cell. Therefore, the memory cell power supply can be set to a higher level than that of a semiconductor memory device to be used under a low temperature condition.

If the memory cell size varies, the characteristics, for example, of the transistors forming the memory cell vary. Therefore, the write level of the memory cell differs for each SRAM macro. For example, if there are an SRAM macro in which the write level of the memory cell is low and an SRAM macro in which the write level is high, the memory cell power supply of the SRAM macro for which it is easier to write data to the memory cell (the one with a higher write level) can be set to a higher level than that of the SRAM macro for which it is less easy to write data to the memory cell (the one with a lower write level).

If the operating power supply voltage varies between SRAM macros, the memory cell write level varies therebetween. Typically, an SRAM macro with a higher operating power supply voltage has a larger write margin, and it is easier to write data to the memory cell. As the operating power supply voltage of an SRAM macro is lower, the write margin is smaller, whereby it is more difficult to write data to the memory cell. Therefore, the memory cell power supply of an SRAM macro with a higher operating power supply voltage can be set to a higher level than that of an SRAM macro with a lower operating power supply voltage.

Moreover, if the threshold voltage of the transistors of the memory cell varies, the write level will vary from one SRAM macro to another, whereby settings similar to those described above are applicable.

Thus, in cases such as where the temperature of use is high, where it is easy to write data due to, for example, the transistor characteristics according to the memory cell size, and where an SRAM macro with a high operating power supply voltage or an SRAM macro with a low threshold voltage is used, the voltage divider ratio of the P-type MOS transistors QP6 and QP7 of the memory cell power supply control circuit 3 can be set so that the level of the memory cell power supply is high.

More specifically, the transistor driving capability of the P-type MOS transistor QP7 can be set to a low level. As the transistor driving capability of the P-type MOS transistor QP7 is lowered, it is also possible to reduce the through current flowing through the P-type MOS transistors QP6 and QP7 in a write operation period and to realize a low power consumption. Moreover, lowering the transistor driving capability allows for a reduction in the layout area.

In a case where the same substrate carries SRAM macros differing from one another in terms of the ease of writing data dependent on the transistor characteristics, etc., according to the memory cell size in the SRAM macro, the operating power supply voltage, the threshold voltage, etc., the settings can be done so that the voltage divider ratio will differ from one another in view of these differences. At present, the scale of semiconductor integrated circuits such as system LSIs has become very large, and it is common to have semiconductor memory devices of different bit and word configurations formed on the same substrate. There are also products such as those called "multi-VT (threshold voltages)" in which transistor characteristics of different threshold voltages are provided on the same substrate so that a circuit block of a stringent speed requirement is formed by transistors of lower threshold voltages, whereas a circuit block for which a lower power consumption is more important than a higher speed is formed by transistors of higher threshold voltages. In such a case, the voltage divider ratios can be determined so that an appropriate memory cell power supply voltage is supplied to each SRAM macro.

Determination of Driving Capability

The driving capability of the P-type MOS transistors QP6 and QP7 can be determined according to the number of memory cells to which the power supply voltage is supplied, the required write speed, etc., so that it is possible to reliably complete a write operation within a predetermined period of time while it is possible to obtain a sufficient margin for erroneous writing. Specifically, it is done as follows.

For example, assume that the transistor driving capability of the P-type MOS transistors QP6 to QP8 of the memory cell power supply control circuit 3 and the leak compensation circuit 4 has been optimized for an SRAM in which 512 memory cells are connected along the same bit line. Assume that the optimization is directly applied to another SRAM in which 32 memory cells are connected along the same bit line.

The voltage level (the DC-wise voltage level) of the memory cell power supply, which is output based on the voltage divider ratio of the P-type MOS transistors QP6 and QP7 of the memory cell power supply control circuit 3, stays substantially constant against changes in the number of memory cells. Therefore, the memory cell power supply control circuit 3, which is designed for an application where the number of memory cells is 512, can be used in another application where the number of memory cells is 32. However, a change in the number of memory cells connected along the same bit line and a change in the bit line length of the memory cell mean a change in the load capacity of the memory cell power supply. In a case where the number of memory cells is 32, as compared with a case where it is 512, the load capacity of the memory cell power supply is smaller, whereby the voltage level (the dynamic voltage level) of the memory cell power supply changes more quickly than necessary. Rapid changes in the memory cell power supply may possibly cause corruption of data stored in memory cells. In this case, it is only necessary that the change in the memory cell power supply is completed within a period of time that is required for completing a write operation to a memory cell. Thus, the transistor driving capability of the P-type MOS transistors QP6 and QP7 of the memory cell power supply control circuit 3 can be lowered.

SRAM macros of different write speed requirements will be discussed below. If the required write speed is slow, it is only necessary that the change in the memory cell power supply is completed within a period of time that is required for completing a write operation to a memory cell. Thus, again, the transistor driving capability of the P-type MOS transistors QP6 and QP7 of the memory cell power supply control circuit 3 can be lowered.

Thus, the transistor driving capability can be lowered for an SRAM macro with a smaller number of memory cells or for an SRAM macro where the required write speed is slow. If the transistor driving capability is lowered, the through current flowing through the P-type MOS transistors QP6 and QP7 is reduced, whereby it is possible to reduce the power consumption of the semiconductor memory device. Moreover, lowering the transistor driving capability allows for a reduction in the layout area.

As described above with respect to the voltage divider ratio, the driving capability can be lowered in a case where the temperature of use is high, in a case where it is easy to write data due to, for example, the transistor characteristics according to the memory cell size, and in a case where an SRAM macro with a high operating power supply voltage or an SRAM macro with a low threshold voltage is used.

With respect to the number of memory cells, the write speed requirement, the memory cell size, the operating power supply voltage and the threshold voltage, if a plurality of SRAM macros differing from one another in terms of these parameters are provided on the same substrate, the driving capability of each SRAM macro can be determined to be different from those of the other SRAM macros in view of these parameters.

Inactivation of Memory Cell Power Supply Control Circuit 3

In a case where data can be written to a memory cell with no problems even without lowering the memory cell power supply from the VDD level (i.e., without increasing the write level of the memory cell), the gate input of the P-type MOS transistor QP7 of the memory cell power supply control circuit 3 may be controlled so as to be fixed at the H level, to thereby achieve a state where the memory cell power supply control circuit 3 is always inactive, i.e., a state where the memory cell power supply is always outputting only the VDD level by the P-type MOS transistor QP6 being always ON.

Specifically, cases where data can be written with no problems include, for example, a case where the number of memory cells connected along the same bit line is relatively small (each memory cell thus having a shorter bit line length), a case where the required write speed is relatively slow, a case where the memory cell size is small, a case where the operating power supply voltage is relatively high, and a case where the threshold voltage of transistors of the memory cell is relatively low.

Figure 5:
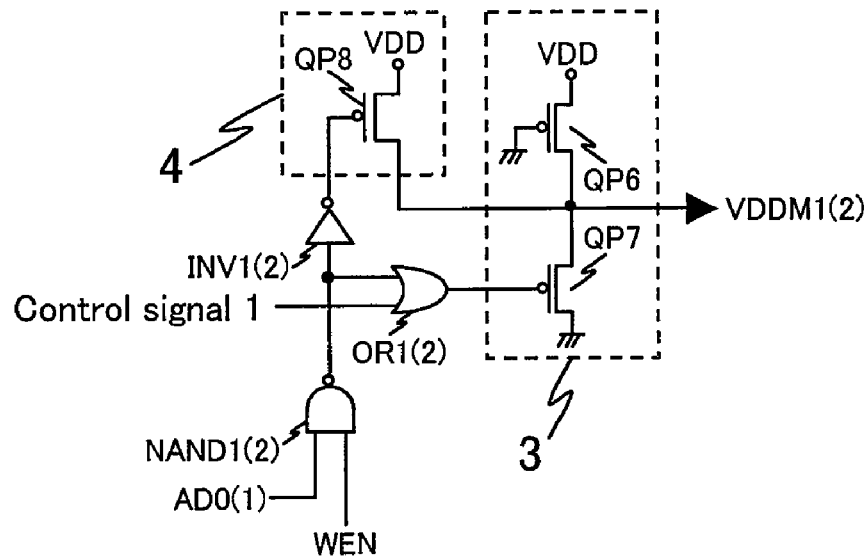
FIG. 5 is a circuit diagram showing a configuration of a memory cell power supply control circuit of Reference Example 5.

Specifically, as shown in FIG. 5, a 2-input OR circuit OR1 (OR2), which is controlled by a control signal 1 and the output node of the 2-input NAND circuit NAND1 (NAND2), is inserted between the output node of the 2-input NAND circuit NAND1 (NAND2) and the gate terminal input of the P-type MOS transistor QP7 of the memory cell power supply control circuit 3 shown in FIG. 1. If the H level is input as the control signal 1, the output of the 2-input OR circuit OR1 (OR2) is at the H level, whereby the P-type MOS transistor QP7 whose gate terminal receives the output of the 2-input OR circuit OR1 (OR2) is turned OFF. Therefore, it is possible to easily control the memory cell power supply control circuit 3 to be always inactive. If the memory cell power supply control circuit 3 is controlled to be always inactive, there will be no through current flowing through the P-type MOS transistors QP6 and QP7 during a write operation period, whereby it is possible to reduce the power consumption.

Also with this configuration where the memory cell power supply control circuit 3 can be made inactive, if a plurality of SRAM macros differing from one another in terms of the number of memory cells connected along the same bit line (the bit line length of each memory cell), the write speed requirement, the memory cell size, the operating power supply voltage, or the threshold voltage of transistors of the memory cell, are provided on the same substrate, a configuration as shown in FIG. 5 may be used so that the memory cell power supply control circuit 3 can be controlled to be always inactive only for some SRAM macros depending on the difference in terms of the above parameters.

The memory cell power supply control circuit 3 may be controlled to be always inactive as described above depending on a predetermined temperature of use, or whether or not to control the memory cell power supply control circuit 3 to be inactive may be determined depending on the actual temperature of use.

Regarding Driving Capability, Etc., of Leak Compensation Circuit 4

Next, the driving capability, etc., of the leak compensation circuit 4 will be discussed.

In cases such as where the semiconductor memory device is used under a low temperature condition, the threshold voltage of transistors of the memory cell increases, whereby the leak current flowing through the memory cell decreases. If the leak current decreases, the driving capability of the P-type MOS transistor of the leak compensation circuit 4 can be lowered. Lowering the transistor driving capability allows for a reduction in the layout area.

With respect to the P-type MOS transistor QP8 of the leak compensation circuit 4, the P-type MOS transistor QP8 designed for an application where the number of memory cells is 512 can be used in another application where the number of memory cells is 32. As the number of memory cells connected along the same bit line is decreased from 512 to 32, the leak current through the memory cells also decreases. Therefore, the transistor driving capability is only required to be at a level such that it is possible to compensate for the leak current for 32 memory cells. Thus, it is possible to lower the transistor driving capability, and lowering the transistor driving capability allows for a reduction in the layout area.

In an SRAM macro with a high transistor threshold voltage, the leak current flowing through the memory cell is decreased, whereby it is possible to lower the driving capability of the P-type MOS transistor QP8 of the leak compensation circuit 4, and lowering the transistor driving capability allows for a reduction in the layout area.

In a case where there is only a slight leak current through the memory cell, and there is substantially no voltage drop in the memory cell power supply due to the leak current, there will be no deterioration in the static noise margin of the memory cell, and the leak compensation circuit 4 can therefore be omitted. In such a case, the gate input of the P-type MOS transistor QP8 of the leak compensation circuit 4 can be controlled to be fixed at the H level, whereby the leak compensation circuit 4 is always inactive.

Figure 6:
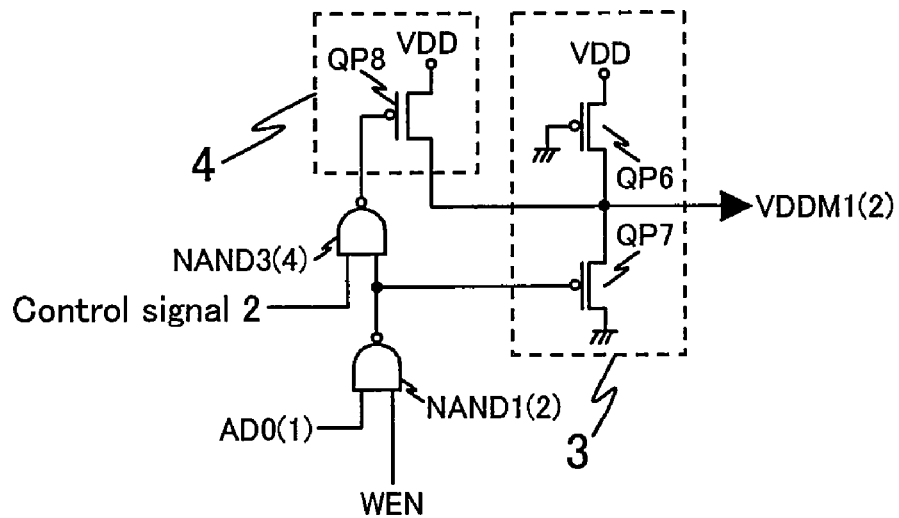
FIG. 6 is a circuit diagram showing another configuration of a memory cell power supply control circuit of Reference Example 5.

Specifically, as shown in FIG. 6, the inverter INV1 (INV2) shown in FIG. 1 is replaced by a 2-input NAND circuit NAND3 (NAND4) so that one input of the 2-input NAND circuit NAND3 (NAND4) can be controlled by a control signal 2. If the L level is input as the control signal 2, the output of the 2-input NAND circuit NAND3 (NAND4) is at the H level, whereby the P-type MOS transistor QP8 whose gate terminal receives the output of the 2-input NAND circuit NAND3 (NAND4) is turned OFF. Therefore, it is possible to easily control the leak compensation circuit 4 to be always inactive.

Again, in a case where a plurality of SRAM macros differing from one another in terms of the number of memory cells connected along the same bit line (the bit line length of each memory cell), the write speed requirement, or the threshold voltage of transistors of the memory cell, are provided on the same substrate, the driving capability may be varied depending on these parameters, or a configuration such as that shown in FIG. 6 may be used only for some SRAM macros so that the leak compensation circuit 4 can be controlled to be always inactive.

As described above, if the memory cell power supply control circuit 3 and the leak compensation circuit 4 are configured so that they have optimal transistor characteristics depending on the various configurations and conditions, it is possible to easily reduce the power consumption or the area. Specifically, it is possible to easily realize both the ease of writing and a desirable write margin by controlling the characteristics of the memory cell power supply control circuit 3 and the leak compensation circuit 4 while the semiconductor memory device is being used by using a control signal produced inside the semiconductor integrated circuit, an external control signal, or the like, according to changes in the temperature, the power supply voltage or the operating frequency (the write speed requirement) and changes in the threshold voltage by the back-bias control, etc. Alternatively, when producing semiconductor memory devices of various specifications, configurations as shown in FIG. 5 and FIG. 6 can be used with various control signals according to the various specifications being fixedly input thereto. Then, by using the same SRAM macros, it is possible to produce a semiconductor memory device in which the memory cell power supply voltage varies and a semiconductor memory device in which it is constant. Thus, it is not necessary to develop different types of SRAM macros having different functions and different characteristics, and the development period can be easily shortened. This can be particularly effective for so-called "memory compliers", and the like, capable of variably producing semiconductor memory devices of different bit and word configurations (address spaces).

REFERENCE EXAMPLE 6

Figure 7:
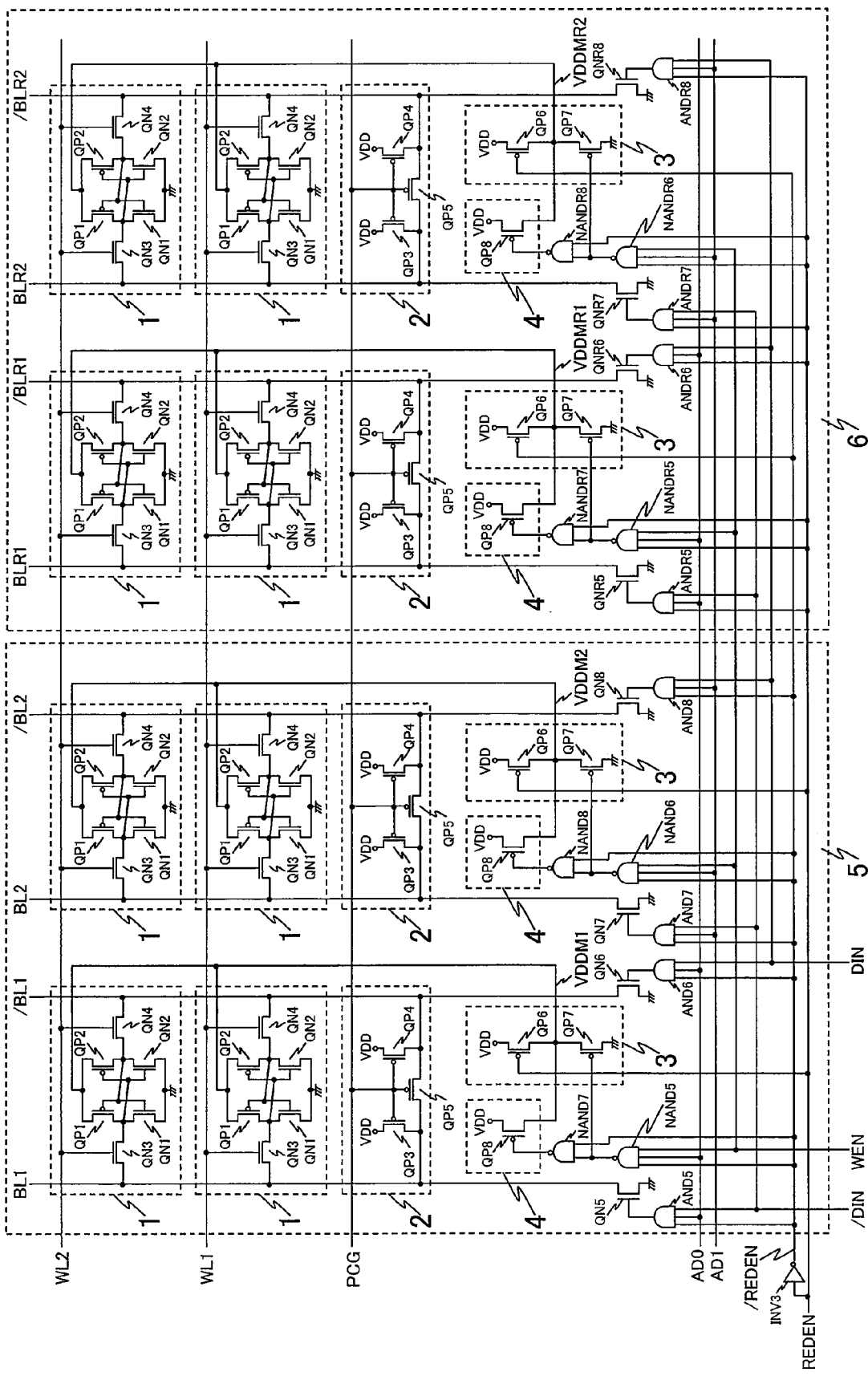
FIG. 7 is a circuit diagram showing a configuration of a semiconductor memory device having a redundant circuit block of Reference Example 6.

FIG. 7 shows a configuration of a semiconductor memory device according to Reference Example 6 of the present invention. Circuits for reading data are omitted in the figure for the sake of simplicity.

The semiconductor memory device shown in FIG. 7 includes the memory cells 1, the precharge circuits 2, the memory cell power supply control circuits 3, the leak compensation circuits 4, a regular circuit block 5, and a redundant circuit block 6. In FIG. 7, QN1 to QN2 are drive transistors, QN3 to QN4 are access transistors, QN5 to QN8 and QNR5 to QNR8 are N-type MOS transistors, QP1 to QP2 are load transistors, QP3 to QP4 are precharge transistors, QP5 is an equalization transistor, QP6 to QP8 are P-type MOS transistors, INV3 is an inverter, AND5 to AND8 and ANDR5 to ANDR8 are 3-input AND circuits, NAND5 to NAND6 and NANDR5 to NANDR6 are 3-input NAND circuits, NAND7 to NAND8 and NANDR7 to NANDR8 are 2-input NAND circuits, WL1 to WL2 are word lines, BL1 to BL2 and /BL1 to /BL2 are bit lines, BLR1 to BLR2 and /BLR1 to /BLR2 are redundant bit lines, PCG is a precharge control signal, AD0 to AD1 are column address signals, DIN and /DIN are input data, WEN is a write enable control signal, REDEN is a redundant signal, /REDEN is an inverted redundant signal, VDDM1 to VDDM2 are memory cell power supplies, VDDMR1 to VDDMR2 are redundant memory cell power supplies, VDD is the power supply. The memory cells 1, the precharge circuits 2, the memory cell power supply control circuits 3 and the leak compensation circuits 4 are the same as those described above in Reference Example 1. The components of the redundant circuit block 6 are the same as those of the regular circuit block 5.

Typically, in order to improve the product yield, a semiconductor memory device has a redundant circuit block including a spare memory cell array, in addition to a regular circuit block including a regular memory cell array. During the inspection process of the semiconductor memory device, if it is determined that there is a defective memory cell in a normal memory cell array, the defective memory cell array is replaced by the spare memory cell array, so as to complete the semiconductor memory device as a non-defective product. This is called "defect relief by redundancy". The semiconductor memory device of the present reference example includes the redundant circuit block 6 as a redundant circuit block for the regular circuit block 5.

In the semiconductor memory device of the present reference example, the redundant signal REDEN is controlled to the L level when defect relief is not performed, whereas the redundant signal REDEN is controlled to the H level when defect relief is performed.

First, a case where defect relief is not performed will be discussed. Where defect relief is not performed, the redundant signal REDEN is at the L level, whereby the inverted redundant signal /REDEN being the output of the inverter INV3, which receives the redundant signal REDEN, is at the H level. In the regular circuit block 5, the inverted redundant signal /REDEN is at the H level, whereby the 3-input AND circuits AND5 to AND8, which receive the inverted redundant signal /REDEN being at the H level, are equivalent logics to the 2-input AND circuits AND1 to AND4 of Reference Example 1 shown in FIG. 1. The 3-input NAND circuits NAND5 to NAND6 are equivalent logics to the 2-input NAND circuits NAND1 to NAND2 of Reference Example 1 shown in FIG. 1. The 2-input NAND circuits NAND7 to NAND8 are equivalent logics to the inverters INV1 to INV2 of Reference Example 1 shown in FIG. 1. Moreover, the P-type MOS transistor QP6, which receives the redundant signal REDEN being at the L level, is equivalent in operation to the P-type MOS transistor QP6 of Reference Example 1 shown in FIG. 1.

As described above, it can be seen that where defect relief is not performed, the circuit configuration and the operation of the regular circuit block 5 of FIG. 7 are equal to those of Reference Example 1 shown in FIG. 1.

The redundant circuit block 6 will now be described. Where defect relief is not performed, the redundant circuit block 6 does not need to operate. Since the 3-input AND circuits ANDR5 to ANDR8, which receive the redundant signal REDEN being at the L level, all output the L level, the N-type MOS transistors QNR5 to QNR8, which receive outputs of the 3-input AND circuits ANDR5 to ANDR8, respectively, are always OFF. Therefore, where defect relief is not performed, there is no influence on the redundant bit lines BLR1 to BLR2 and /BLR1 to /BLR2. Since the 3-input NAND circuits NANDR5 to NANDR6, which receive the redundant signal REDEN being at the L level, all output the H level, the P-type MOS transistor QP7, which receives the output of one of the 3-input NAND circuits NANDR5 to NANDR6, is always OFF. The P-type MOS transistor QP6, which receives the inverted redundant signal /REDEN being at the H level, is also always OFF. Therefore, the memory cell power supply control circuits 3 in the redundant circuit block 6 are all inactive in a case where defect relief is not performed. Since the 2-input NAND circuits NANDR7 to NANDR8, which receive the redundant signal REDEN being at the L level, all output the H level, the P-type MOS transistor QP8, which receives the output of one of the 2-input NAND circuits NANDR7 to NANDR8, is also always OFF. Therefore, the leak compensation circuits 4 in the redundant circuit block 6 are all inactive in a case where defect relief is not performed.

As described above, where defect relief is not performed, the memory cell power supply control circuits 3 and the leak compensation circuits 4 in the redundant circuit block 6 of FIG. 7 are all inactive, whereby the redundant memory cell power supply VDDMR1 (VDDMR2) is not supplied. Therefore, power is not supplied to the memory cells 1 in the redundant circuit block 6, and the excessive leak current, or the like, does not flow through the memory cells 1, whereby it is possible to reduce the power consumption of the semiconductor memory device.

Now, a case where defect relief is performed will be discussed. In this case, the redundant circuit block 6 operates, instead of the regular circuit block 5. Where defect relief is performed, the redundant signal REDEN is at the H level, whereby the inverted redundant signal /REDEN being the output of the inverter INV3, which receives the redundant signal REDEN, is at the L level.

In the redundant circuit block 6, the redundant signal REDEN is at the H level, whereby the 3-input AND circuits ANDR5 to ANDR8, which receives the redundant signal REDEN being the H level, are equivalent logics to the 2-input AND circuits AND1 to AND4 of Reference Example 1 shown in FIG. 1. The 3-input NAND circuits NANDR5 to NANDR6 are equivalent logics to the 2-input NAND circuits NAND1 to NAND2 of Reference Example 1 shown in FIG. 1. The 2-input NAND circuits NANDR7 to NANDR8 are equivalent logics to the inverters INV1 to INV2 of Reference Example 1 shown in FIG. 1. The P-type MOS transistor QP6, which receives the inverted redundant signal /REDEN being at the L level, is equivalent in operation to the P-type MOS transistor QP6 of Reference Example 1 shown in FIG. 1.

As described above, it can be seen that where defect relief is performed, the circuit configuration and the operation of the redundant circuit block 6 of FIG. 7 are equal to those of Reference Example 1 shown in FIG. 1.

The regular circuit block 5 will now be described. Where defect relief is performed, the regular circuit block 5 does not need to operate. Since the 3-input AND circuits AND5 to AND8, which receive the inverted redundant signal /REDEN being at the L level, all output the L level, the N-type MOS transistors QN5 to QN8, which receive the 3-input AND circuits AND5 to AND8, respectively, are always OFF. Therefore, where defect relief is performed, there is no influence on the bit lines BL1 to BL2 and /BL1 to /BL2. Since the 3-input NAND circuits NAND5 to NAND6, which receive the inverted redundant signal /REDEN being at the L level, all output the H level, the P-type MOS transistor QP7, which receives the output of one of the 3-input NAND circuits NAND5 to NAND6, is always OFF. The P-type MOS transistor QP6, which receives the redundant signal REDEN being the H level, is also always OFF. Therefore, the memory cell power supply control circuits 3 in the regular circuit block 5 are all inactive in a case where defect relief is performed. Since the 2-input NAND circuits NAND7 to NAND8, which receive the inverted redundant signal /REDEN being at the L level, all output the H level, the P-type MOS transistor QP8, which receives the output of one of the 2-input NAND circuits NAND7 to NAND8, is also always OFF. Therefore, the leak compensation circuits 4 in the regular circuit block 5 are all inactive in a case where defect relief is performed.

As described above, where defect relief is performed, the memory cell power supply control circuits 3 and the leak compensation circuits 4 in the regular circuit block 5 of FIG. 7 are all inactive, whereby the memory cell power supply VDDM1 (VDDM2) is not supplied. Therefore, power is not supplied to the memory cells 1 in the regular circuit block 5, and the excessive leak current, or the like, does not flow through the memory cells 1, whereby it is possible to reduce the power consumption of the semiconductor memory device.

EMBODIMENT 1

In Reference Example 1, the example of lowering the voltages of the source nodes of the load transistors QP1 and QP2 (the voltages of the memory cell power supplies VDDM1 and VDDM2) from the VDD level is described, each of the source nodes being the power supply node of the flip-flop forming the memory cell. However, the voltages of the source nodes of the drive transistors QN1 and QN2 (the voltages of the memory cell power supplies VSSM1 and VSSM2) may be increased from the ground level, each of the source nodes being the power supply node of the flip-flop forming the memory cell. Also in this case, the voltage at which data can be written to the memory cell is improved (the write level of the memory cell is increased) in a data write operation for the memory cell, and there are also improvements on the lower limit operating voltage of the semiconductor memory device and the speed at which data is written to the memory cell.

Specifically, for example, in FIG. 1 illustrating Reference Example 1, in order to control the voltages of the source nodes of the load transistors QP1 and QP2 in the memory cells 1 (the voltages of the memory cell power supplies VDDM1 and VDDM2) to be lowered from the VDD level, each of the memory cell control circuits 3 and each of the leak compensation circuits 4 are formed as follows. In each of the memory cell control circuits 3, the P-type MOS transistor QP6 being always ON and the P-type MOS transistor QP7 controlled by the column address signal and the write enable control signal are connected in series together, thereby forming a source follower. Each of the leak compensation circuits 4 supplies the VDD level to the corresponding memory cell power supply VDDM1 (VDDM2), and thus includes the P-type MOS transistor QP8.

Figure 8:
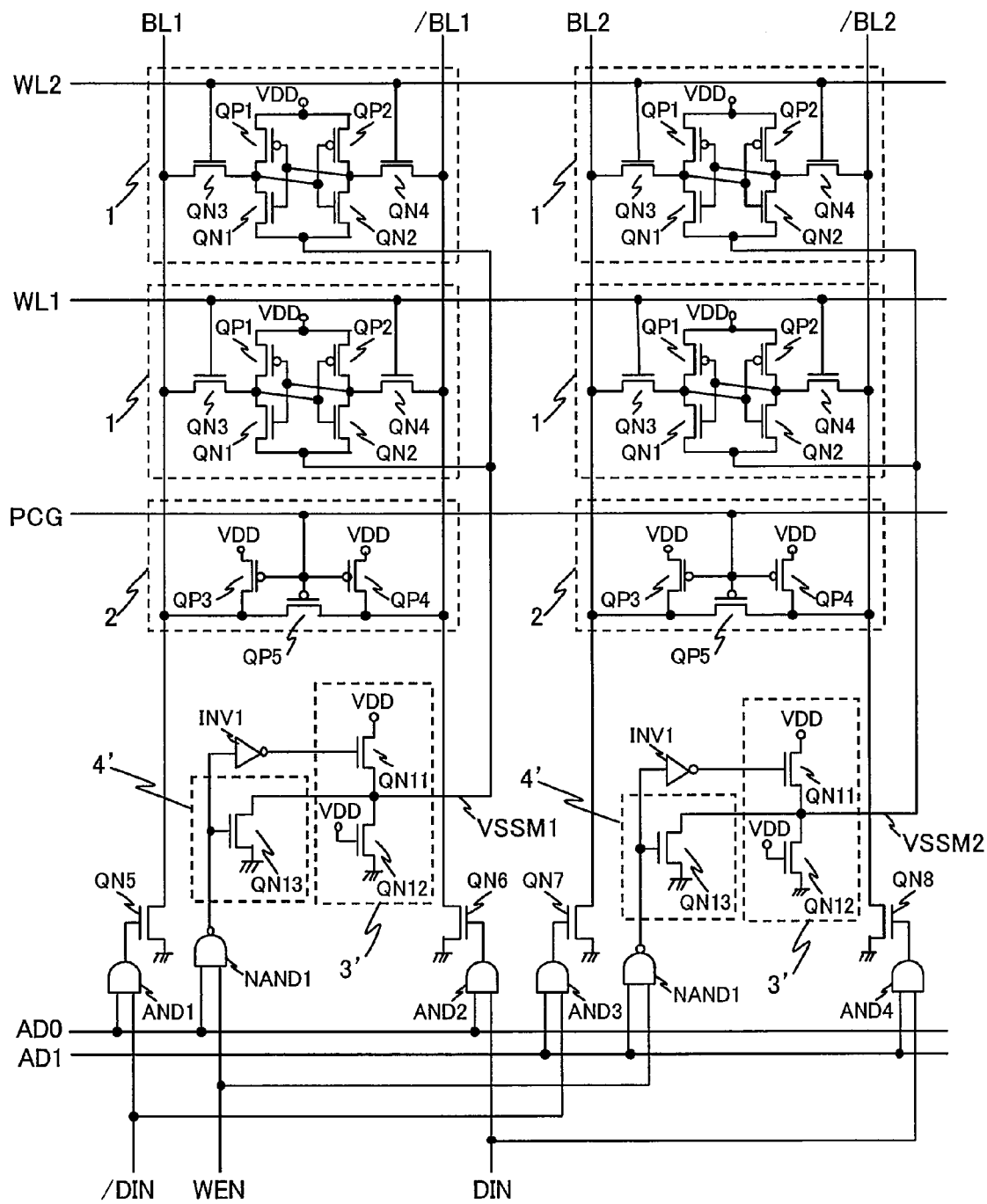
FIG. 8 is a circuit diagram showing a configuration of a semiconductor memory device of Embodiment 1.

However, as shown in FIG. 8, Embodiment 1 includes memory cell control circuits 3' in order to increase the voltages of the source nodes of the drive transistors QN1 and QN2 (the voltages of the memory cell power supplies VSSM1 and VSSM2) from the ground level, each of the source nodes being the power supply node of the flip-flop forming the memory cell 1. In each of the memory cell control circuits 3', an N-type MOS transistor QN11 controlled by the column address signal AD0 (AD1) and the write enable control signal WEN is serially connected with an N-type MOS transistor QN12 being always ON, thereby forming a source follower. Each of the leak compensation circuits 4' supplies the ground level to the corresponding memory cell power supply VDDM1 (VDDM2), and thus includes an N-type MOS transistor QN13. Moreover, control signals respectively having inverted polarities of the control signals which control the memory cell control circuits 3 and the leak compensation circuits 4 in FIG. 1 are input as control signals controlling the memory cell control circuits 3' and the leak compensation circuits 4' in FIG. 8.

Variation

Note that, the polarities of the MOS transistors QN11 to QN13 are not limited to the above-mentioned polarities. As described in Reference Examples 2 and 3 (FIGS. 2 and 3), various combinations of P-type and N-type transistors may be possible. The various combinations make it possible to easily set the voltage divider ratio according to the threshold voltages of the drive transistors QN1 and QN2, the load transistors QP1 and QP2, and the access transistors QN3 and QN4.

Figure 9:
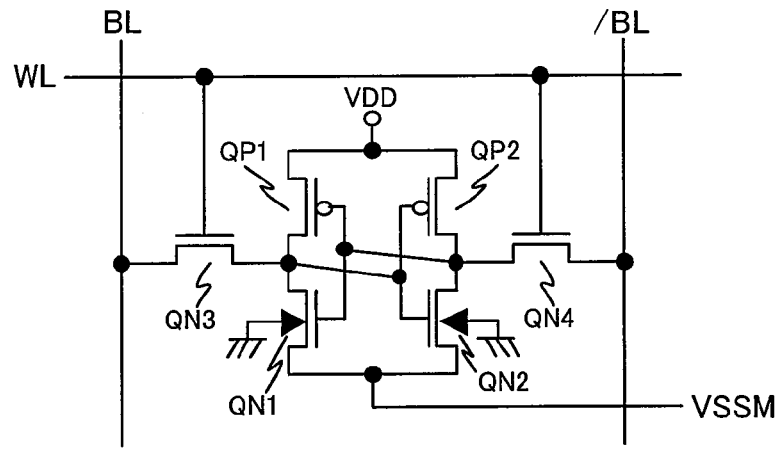
FIG. 9 is a circuit diagram showing a configuration of a memory cell of an alternative Embodiment of the semiconductor memory device of Embodiment 1.

Similar to the description in Reference Example 4, it is preferable as shown in FIG. 9 that the substrate nodes of the drive transistors (QN1 and QN2) of the memory cells are connected to the ground (it is preferable to separate the source nodes of the drive transistors from the substrate nodes). That is, in a write operation period, the memory cell power supplies (VSSM1 and VSSM2) of the memory cells 1 connected to the selected bit lines increase from the ground level. If the substrate nodes of the drive transistors are at the ground level, there will be a substrate bias effect for the drive transistors, whereby the threshold voltage of the drive transistors increases and the driving capability decreases. Therefore, in a write operation, it is possible to easily write data to the memory cells. The threshold voltage of the drive transistors increases, whereby the leak current flow through the memory cell decreases. This makes it possible to reduce the power consumption.

Moreover, similar to the description in Reference Example 5, the static noise margin of the memory cells can be improved in FIG. 8 at the same time by controlling the voltages of the power supplies (VSSM1 and VSSM2) of the memory cells connected to non-selected bit lines to be lower than or equal to the ground level in a write operation period, while controlling the voltages of the power supplies (VSSM1 and VSSM2) of all the memory cells to be lower than or equal to the ground level in a non-write operation period (in a read operation period). Specifically, this can be easily achieved by replacing the level of the ground received by the source terminal of the N-type MOS transistor QN13 forming the leak compensation circuit 4' of FIG. 8 with a level lower than or equal to the ground level. A voltage having a level lower than or equal to the ground level can be applied by providing a step-down circuit capable of generating a voltage lower than or equal to the ground level inside the SRAM macro, or may be supplied from outside the SRAM macro.

Also in the arrangement illustrated in FIG. 8, as described above, various settings are possible, for example, for the output voltages and the driving capability of the memory cell power supply control circuits 3' and the leak compensation circuits 4'.

Moreover, the arrangement in FIG. 8 may be applied to the memories as described in Reference Example 6 (FIG. 7) where defect relief can be performed.

EMBODIMENT 2

A semiconductor memory device including flip-flop-type memory cells, such as the SRAMs described in Reference Example 1 (FIG. 1), can store and hold data written in the memory cells, as long as the memory cell power supplies VDDM1 and VDDM2 are supplied to memory cell sections (flip-flops), even when other power supplies (peripheral circuit power supplies: for example, AND1, NAND1, and INV1 in FIG. 1) excepting the memory cell power supplies VDDM1 and VDDM2 are turned off. Therefore, in the memory cell power supplies VDDM1 and VDDM2 being separate from the peripheral circuit power supplies, for example, during an inactive period of the semiconductor memory device (i.e., during the data storage and holding period in which writing and reading of data are not performed to the semiconductor memory device), the peripheral circuit power supplies are turned off, and only the memory cell power supplies VDDM1 and VDDM2 are provided, whereby it is possible to reduce the power consumption of the semiconductor memory device.

In this case, each of the memory cell power supplies VDDM1 and VDDM2 is provided by the source power supply of the P-type MOS transistor QP6 of the memory cell power supply control circuit 3 and by the source power supply of the P-type MOS transistor QP8 of the leak compensation circuit 4. However, the memory cell power supply control circuit 3 and the leak compensation circuit 4 are controlled by the output signal of the 2-input NAND circuit NAND1 (NAND2), and the like receiving the peripheral circuit power supply. Therefore, each of the memory cell power supplies VDDM1 and VDDM2 may not be provided appropriately, because the mere separation of the peripheral circuit power supply from the source power supply may cause the output signal of the 2-input NAND circuit NAND1 (NAND2), and the like to have an irregular level, when the peripheral circuit power supply is turned off (After a lapse of a long time after the peripheral circuit power supply has been turned off, each node in the peripheral circuit attains the ground level or approximates to the ground level. However, immediately after the peripheral circuit power supply is turned off, the nodes in the peripheral circuit may be at an unstable level).

Figure 10:
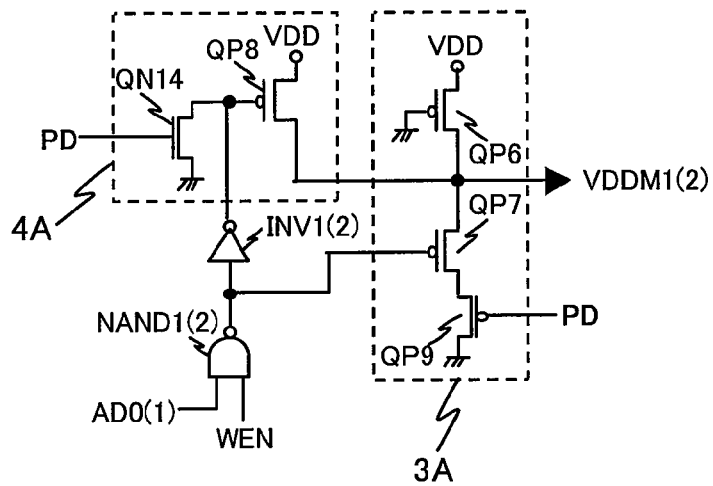
FIG. 10 is a circuit diagram showing a configuration of a memory cell power supply control circuit of Embodiment 2.

To cope with this problem, for example, an arrangement as shown in FIG. 10 is realized. In this arrangement, it is possible to ensure providing the memory cell power supplies VDDM1 and VDDM2. That is, compared to the memory cell power supply control circuit 3, a memory cell power supply control circuit 3A has a P-type MOS transistor QP9 serially connected between the drain terminal of the P-type MOS transistor QP7 and the ground, the P-type MOS transistor QP9 being controlled by a peripheral circuit power supply turn off signal PD (a signal which attains the H level irrelevant to the level of the peripheral circuit power supply, when the terminal circuit power supply is turned off). Serially connecting the P-type MOS transistor QP9 allows the memory cell power source control circuit 3A to certainly stop its function (of outputting the divided voltage level to the memory cell power supplies VDDM1 and VDDM2) irrelevant from the irregular output level of the 2-input NAND circuit NAND1 (NAND2), when the peripheral circuit power supply is turned off.

Moreover, compared to the leak compensation circuit 4, a leak compensation circuit 4A has an N-type MOS transistor QN14 further provided to the output node of the inverter INV1 (INV2), the N-type MOS transistor QN14 being controlled by the peripheral circuit power supply turn-off signal PD. When the peripheral circuit power supply is turned off, the peripheral circuit power supply turn-off signal PD attains the H level. Consequently, the N-type MOS transistor QN14 is turned on, and the output node of the inverter INV1 (INV2) certainly attains the L level, so that the P-type MOS transistor QP8 is turned on. As a result, the memory cell power supply VDDM1 (VDDM2) certainly provides a power supply for the memory cell section to the memory cell.

Even in a case where the peripheral circuit power supplies are separate from the power supplies VDDM1 and VDDM2 such that the peripheral circuit power supplies can be independently turned off, the arrangement shown in FIG. 10 enables normal storage and holding of data in a memory cell during the OFF period of the peripheral circuit power supply as described above. Therefore, it is possible to reduce the power consumption of the semiconductor memory device.

This arrangement may be applied to the arrangement shown in FIG. 8.

EMBODIMENT 3

Figure 11:
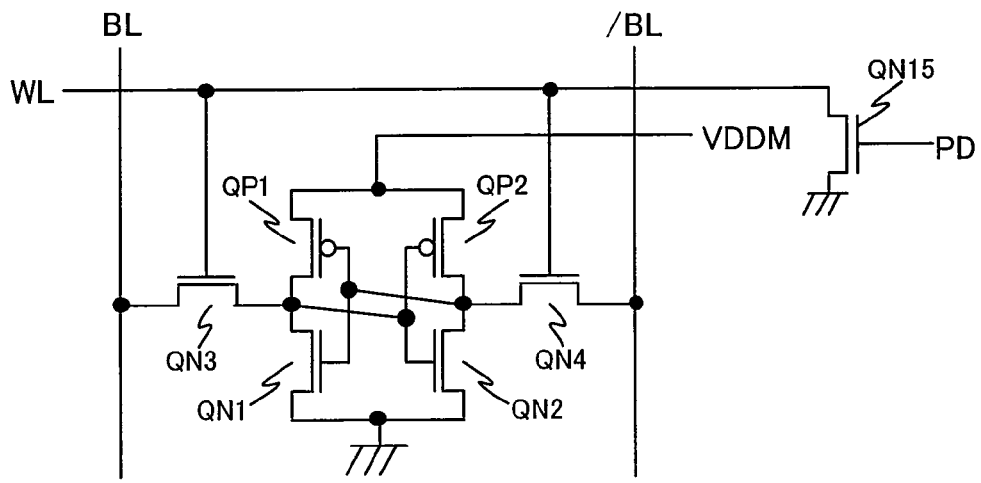
FIG. 11 is a circuit diagram showing a configuration of a memory cell of Embodiment 3.

Turning off the peripheral circuit power supply may cause an unstable level of the word line WL controlling the access transistors QN3 and QN4 in the same manner as mentioned above. In this case, memory cells on one bit line may cause a short circuit with respect to each other via the access transistors QN3 and QN4, which may damage data in the memory cells. To cope with this problem, it is preferable to control the access transistor of the memory cell to be certainly turned off when the peripheral circuit power supply is turned off. Specifically, the semiconductor memory device further includes transistors QN15 which correspond to the word lines WL on a one-to-one basis as shown in a memory cell of FIG. 11. The transistors QN15 are controlled by the peripheral circuit power supply turn-off signal PD (the signal which attains the H level irrelevant to the level of the peripheral circuit power supply, when the peripheral circuit power supply is off) to enforcedly drop all the word lines WL to the ground level when the peripheral circuit power supply is off. With this structure, it is possible to store and hold memory cell data more stably.

EMBODIMENT 4

When a flip-flop of a memory cell normally operates, data is normally stored and held in the memory cell. That is, data is normally stored and held in a memory cell as long as such a memory cell power supply voltage is applied that can turn on both the load transistor QP1 and the drive transistor QN2, which constitutes a flip-flop, or both the load transistor QP2 and the drive transistor QN1, which constitutes a flip-flop.

More specifically, for example, the absolute value of the threshold voltage of the load transistor QP1 (QP2) of the flip-flop is referred to as VTP, and the threshold voltage of the drive transistor QN1 (QN2) is referred to as VTN. A voltage which exceeds over at least the higher one (a critical voltage for memory holding) of the VTP or VTN is applied as the memory cell power supply voltage, which normally operates the flip-flop. Therefore, it is possible to normally store and hold the data in the memory cell. Meanwhile, the lower the memory cell power supply voltage is, the more can the power consumption of the semiconductor memory device be reduced. Therefore, when the memory cell power supply voltage lowers to the critical voltage for memory holding the data in the memory cell, the lowest power consumption which normally stores and holds the data in the memory cell can be achieved.

Figure 12:
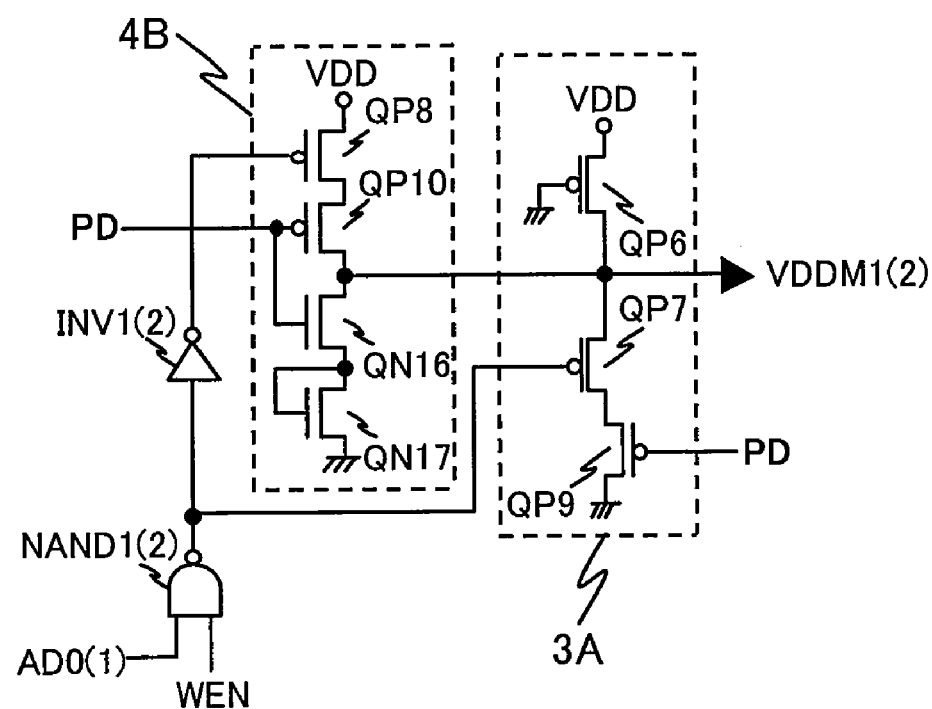
FIG. 12 is a circuit diagram showing a configuration of a memory cell power supply control circuit of Embodiment 4.
Figure 13:
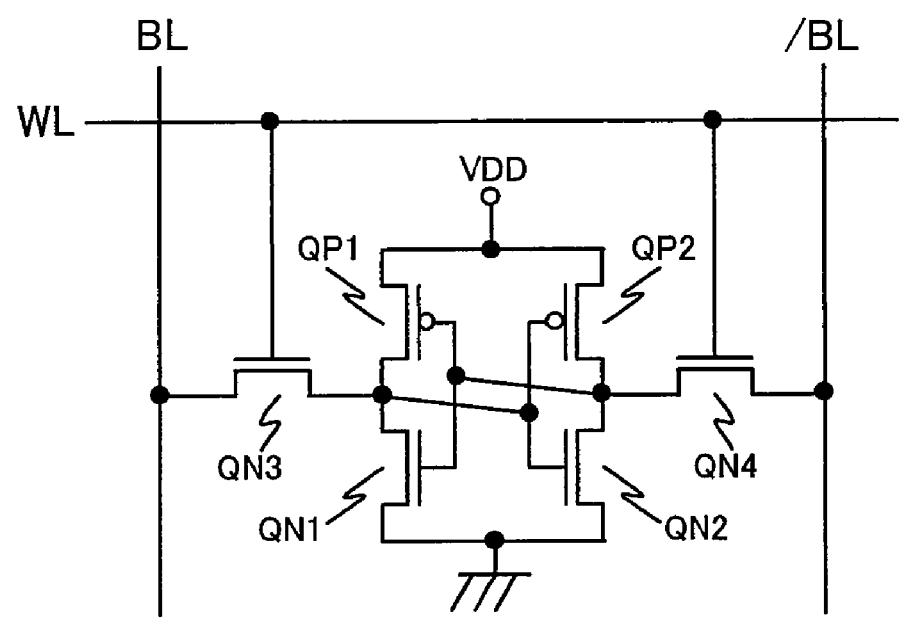
FIG. 13 is a circuit diagram showing a configuration of a conventional semiconductor memory device.

Now, configurations of the leak compensation circuit 4A in FIG. 10 and a leak compensation circuit 4B in FIG. 12 are compared. The leak compensation circuit 4B additionally includes a P-type MOS transistor QP10, an N-type MOS transistor QN16, and an N-type MOS transistor QN17, which are serially connected. The P-type MOS transistor QP10 and the N-type MOS transistor QN16 are both controlled by the peripheral circuit power supply turn-off signal PD. The N-type MOS transistor QN17 has a diode-connected gate and a source terminal connected to the ground. In such leak compensation circuit 4B, it is possible to easily reduce the memory cell power supply voltage to the threshold voltage VTN.

When the peripheral circuit power supply is not turned off, the peripheral circuit power supply turn-off signal PD has the L level, the N-type MOS transistor QN16 is turned off, and the p-type MOS transistor QP10 is turned on. Therefore, in this case, the leak compensation circuit 4B operates in the same manner as, for example, the leak compensation circuit 4 in FIG. 1. Meanwhile, when the peripheral circuit power supply is turned off, the peripheral circuit power supply turn-off signal PD changes to the H level, the p-type MOS transistor QP10 is turned off, and the N-type MOS transistor QN16 is turned on. Therefore, in this case, the memory cell power supply VDDM1 (VDDM2) outputs a voltage having the VTN level determined by the N-type MOS transistor QN17 having the diode-connected gate.

The configuration of the leak compensation circuit 4B as described above includes the N-type MOS transistor QN17 having the diode-connected gate. However, this is a mere example for a case where the VTN determines the critical voltage for memory holding the data in the memory cell. When the VTP determines the critical voltage for memory holding the data in the memory cell, a P-type MOS transistor having a diode-connected gate is used instead.

Moreover, when the threshold voltage of the transistor of the memory cell section and the threshold voltage of the transistor of the peripheral circuit section are different (when dopants of the transistors are different), it is preferable for the transistor having a diode-connected gate in the leak compensation circuit 4B to have the same dopant density as the memory cell section so as to conform the threshold voltages of the transistors.

Note that, the above-mentioned arrangement may be applied to the arrangement shown in FIG. 8.

Components which are the same as or correspond to the components shown in each of the above Embodiments or Reference Examples may be combined in various ways as long as logically possible. Specifically, for example, some of the configurations shown in FIGS. 2 to 6 may be combined with each other, or these configurations may be applied to the configuration with defect relief as shown in FIG. 7, as far as such combinations are logically possible.

Moreover, in the description above, the semiconductor memory device of the present invention includes only a small number of memory cells, precharge circuits, memory cell power supply control circuits, leak compensation circuits, etc., as shown in FIG. 1, FIG. 7, or FIG. 8, in order to facilitate the understanding of the present invention. However, greater numbers of these components may be provided. It is understood that such a semiconductor memory device with a greater number of these components gives the same effect as those given by the semiconductor memory devices of the embodiments above.

As described above, with the semiconductor memory device of the present invention, the memory cell power supply can be optimally controlled according to, for example, the arrangement of the memory cell array, the transistor characteristics, the power supply voltage, the temperature condition, etc. Particularly, by improving the write level of the memory cell, it is possible to realize a semiconductor memory device with stable memory cell characteristics with a low power consumption and a small area. Thus, the present invention is useful as a semiconductor memory device including flip-flop-type memory cells, or the like.

What is claimed is:

1. A semiconductor memory device, comprising:
    a memory cell including a flip-flop; and
    a memory cell power supply circuit for supplying a high cell power supply voltage and a low cell power supply voltage with a lower voltage potential than the high cell power supply voltage to the memory cell,
    wherein the memory cell power supply circuit supplies:
    a predetermined first power supply voltage supplied as the high cell power supply voltage in a case where the high cell power supply voltage is supplied in a data read cycle and in a case where data is not written to the memory cell to which the high cell power supply voltage is supplied in a write cycle, and
    a second power supply voltage lower than the first power supply voltage supplied as the high cell power supply voltage in a case where data is written to the memory cell to which the high cell power supply voltage is supplied in a write cycle,
    further comprising:
    a leak compensation circuit for compensating a leak voltage of the memory cell, and
    a peripheral circuit power supply circuit for supplying a power supply voltage to a peripheral circuit of the memory cell,
    wherein the memory cell power supply circuit further supplies the first power supply voltage, when the power supply voltage to the peripheral circuit is turned off, and the leak compensation circuit always operates, when the power supply voltage to the peripheral circuit is turned off.

2. The semiconductor memory device of claim 1, wherein an access transistor of the memory cell is controlled to be turned off, when the power supply voltage to the peripheral circuit is turned off.

3. The semiconductor memory device of claim 2, further comprising:
a word line-ground transistor connected between a ground and a word line controlling the access transistor,
wherein the word line-ground transistor is turned on so as to control the access transistor to be turned off, when the power supply voltage to the peripheral circuit is turned off.

4. The semiconductor memory device of claim 1, wherein when the power supply voltage to the peripheral circuit is turned off, at least one of the memory cell power supply circuit and the leak compensation circuit supplies a power supply voltage enabling the memory cell to hold memory data.

5. The semiconductor memory device of claim 4, wherein the power supply voltage enabling the memory cell to hold the memory data is generated by serially connecting a transistor having a diode-connected gate, and a transistor controlled by a control signal controlling the power supply voltage to be supplied to the peripheral circuit.

6. The semiconductor memory device of claim 5, wherein the transistor having a diode-connected gate has the same dopant density as a transistor of the memory cell.

7. A semiconductor memory device, comprising:
a memory cell including a flip-flop; and
a memory cell power supply circuit for supplying a high cell power supply voltage and a low cell power supply voltage with a lower voltage potential than the high cell power supply voltage to the memory cell,
wherein the memory cell power supply circuit supplies:
a predetermined first power supply voltage supplied as the low cell power supply voltage in a case where the low cell power supply voltage is supplied in a data read cycle and in a case where data is not written to the memory cell to which the low cell power supply voltage is supplied in a write cycle, and
a second power supply voltage higher than the first power supply voltage supplied as the low cell power supply voltage in a case where data is written to the memory cell to which the low cell power supply voltage is supplied in a write cycle,
further comprising:
a leak compensation circuit for compensating a leak voltage of the memory cell, and
a peripheral circuit power supply circuit for supplying a power supply voltage to a peripheral circuit of the memory cell,
wherein the memory cell power supply circuit further supplies the first power supply voltage, when the power supply voltage to the peripheral circuit is turned off, and
the leak compensation circuit always operates, when the power supply voltage to the peripheral circuit is turned off.

8. The semiconductor memory device of claim 7, wherein an access transistor of the memory cell is controlled to be turned off, when the power supply voltage to the peripheral circuit is turned off.

9. The semiconductor memory device of claim 8, further comprising:
a word line-ground transistor connected between a ground and a word line controlling the access transistor,
wherein the word line-ground transistor is turned on so as to control the access transistor to be turned off, when the power supply voltage to the peripheral circuit is turned off.

10. The semiconductor memory device of claim 7, wherein when the power supply voltage to the peripheral circuit is turned off, at least one of the memory cell power supply circuit and the leak compensation circuit supplies a power supply voltage enabling the memory cell to hold memory data.

11. The semiconductor memory device of claim 10, wherein the power supply voltage enabling the memory cell to hold the memory data is generated by serially connecting a transistor having a diode-connected gate, and a transistor controlled by a control signal controlling the power supply voltage to be supplied to the peripheral circuit.

12. The semiconductor memory device of claim 11, wherein the transistor having a diode-connected gate has the same dopant density as a transistor of the memory cell.

* * * * *